(12) United States Patent
Kamiyama

(10) Patent No.: US 11,165,363 B2
(45) Date of Patent: Nov. 2, 2021

(54) ELECTRONIC MODULE

(71) Applicant: SHINDENGEN ELECTRIC MANUFACTURING CO., LTD., Chiyoda-ku (JP)

(72) Inventor: Yoshihiro Kamiyama, Hanno (JP)

(73) Assignee: SHINDENGEN ELECTRIC MANUFACTURING CO., LTD., Chiyoda-ku (JP)

(*) Notice: Subject to any disclaimer, the term of this patent is extended or adjusted under 35 U.S.C. 154(b) by 516 days.

(21) Appl. No.: 16/081,646

(22) PCT Filed: Jan. 26, 2018

(86) PCT No.: PCT/JP2018/002473
§ 371 (c)(1),
(2) Date: Aug. 31, 2018

(87) PCT Pub. No.: WO2019/146069
PCT Pub. Date: Aug. 1, 2019

(65) Prior Publication Data
US 2021/0050795 A1    Feb. 18, 2021

(51) Int. Cl.
*H05K 1/18* (2006.01)
*H05K 7/20* (2006.01)
(Continued)

(52) U.S. Cl.
CPC .......... *H02M 7/003* (2013.01); *H02K 5/225* (2013.01); *H02K 11/33* (2016.01); *H02M 7/537* (2013.01);
(Continued)

(58) Field of Classification Search
CPC .......... H05K 1/18; H05K 1/0228; H05K 5/22; H05K 5/225; H05K 7/20; H05K 11/00;
(Continued)

(56) References Cited

U.S. PATENT DOCUMENTS 5,375,429 A * 12/1994 Tokizaki ............... F24F 1/0003
62/235.1
2002/0118560 A1 * 8/2002 Ahmed .................. H01L 23/66
363/144

(Continued)

FOREIGN PATENT DOCUMENTS

JP    2011-217463 A    10/2011
JP    2015-20368 A    2/2015
(Continued)

OTHER PUBLICATIONS

International Search Report dated Apr. 3, 2018 in PCT/JP2018/002473 filed Jan. 26, 2018 (with Translation of Categories).

(Continued)

*Primary Examiner* — Xiaoliang Chen
(74) *Attorney, Agent, or Firm* — Oblon, McClelland, Maier & Neustadt, L.L.P.

(57) ABSTRACT

An electronic module includes a shunt resistor having one end that is connected to one end of a first ground wiring line and another end that is connected to another end of a second ground wiring line. Signal terminals are disposed to be close to the shunt resistor, the signal terminals including a first current detection terminal electrically connected to the one end of the shunt resistor, and a second current detection terminal disposed to be close to the shunt resistor and electrically connected to the other end of the shunt resistor. The shunt resistor is disposed to be close to a first side of a substrate along which the signal terminals are arranged.

15 Claims, 3 Drawing Sheets

(51) Int. Cl.
  *H05K 11/00* (2006.01)
  *H02M 7/00* (2006.01)
  *H02M 7/483* (2007.01)
  *H02M 7/537* (2006.01)
  *H02M 7/5387* (2007.01)
  *H02M 1/00* (2006.01)
  *H01L 23/50* (2006.01)
  *H01L 23/495* (2006.01)
  *H01L 23/498* (2006.01)
  *H01L 23/522* (2006.01)
  *H01L 23/528* (2006.01)
  *B62D 5/04* (2006.01)
  *H02K 11/33* (2016.01)
  *H02K 5/22* (2006.01)
  *H02P 27/06* (2006.01)
  *H05K 1/02* (2006.01)
  *H02K 11/27* (2016.01)

(52) U.S. Cl.
  CPC ........... *H02P 27/06* (2013.01); *H05K 1/0228* (2013.01); *H05K 1/18* (2013.01); *H02K 11/27* (2016.01); *H05K 2201/09227* (2013.01); *H05K 2201/10015* (2013.01); *H05K 2201/10022* (2013.01); *H05K 2201/10166* (2013.01); *H05K 2201/10196* (2013.01)

(58) Field of Classification Search
  CPC ......... H05K 11/27; H05K 11/33; H02M 7/00; H02M 7/003; H02M 7/483; H02M 7/537; H02M 7/5387; H02M 1/00; H01L 23/50; H01L 23/495; H01L 23/498; H01L 23/522; H01L 23/528; B62D 5/04
  USPC ............... 361/777, 90, 605, 710; 180/444; 318/400.26; 363/1, 15, 68, 132, 146, 363/163, 605; 310/68 D, 68 R, 91
  See application file for complete search history.

(56) References Cited

U.S. PATENT DOCUMENTS

| | | | | |
|---|---|---|---|---|
| 2005/0152100 A1* | 7/2005 | Rodriguez | ............ | H02M 7/003 361/605 |
| 2005/0152101 A1* | 7/2005 | Rodriguez | ......... | H05K 7/20272 361/605 |
| 2005/0162875 A1* | 7/2005 | Rodriguez | ........... | H05K 7/1432 363/68 |
| 2005/0269895 A1* | 12/2005 | Innami | ................. | B62D 5/0403 310/429 |
| 2006/0006749 A1* | 1/2006 | Sasaki | ................... | H02K 11/33 310/68 R |
| 2006/0007721 A1* | 1/2006 | Rodriguez | ............ | H02M 7/003 363/146 |
| 2006/0198072 A1* | 9/2006 | Inaba | .............. | H03K 19/00376 361/90 |
| 2006/0232942 A1* | 10/2006 | Nakatsu | .................. | B60L 50/16 361/710 |
| 2007/0063661 A1* | 3/2007 | Galli | ........ | H02P 3/22 318/109 |
| 2007/0189048 A1* | 8/2007 | Goto | ................. | B60H 1/00428 363/95 |
| 2007/0222330 A1* | 9/2007 | Innami | ................... | H02K 11/33 310/89 |
| 2008/0115512 A1* | 5/2008 | Rizzo | ................ | B60H 1/00428 62/134 |
| 2008/0203962 A1* | 8/2008 | Maeda | .................... | H02P 25/03 318/721 |
| 2008/0211563 A1* | 9/2008 | Inaba | .................. | H03K 19/018 327/333 |
| 2009/0039729 A1* | 2/2009 | Innami | ................... | H02K 11/33 310/254.1 |
| 2009/0258282 A1* | 10/2009 | Harada | ............... | H01M 10/613 429/61 |
| 2010/0052449 A1* | 3/2010 | Hashimoto | .......... | B62D 5/0406 310/91 |
| 2010/0116570 A1* | 5/2010 | Sugawara | ............. | B60L 58/26 180/65.1 |
| 2010/0248008 A1* | 9/2010 | Sugawara | ............. | H01M 50/20 429/159 |
| 2011/0018485 A1* | 1/2011 | Maeda | .................... | H02P 6/153 318/721 |
| 2012/0034507 A1* | 2/2012 | Harada | ............... | H01M 10/613 429/120 |
| 2012/0098366 A1* | 4/2012 | Yamasaki | .............. | H02K 5/225 310/72 |
| 2012/0098391 A1* | 4/2012 | Yamasaki | .............. | H02K 11/33 310/68 D |
| 2014/0159481 A1* | 6/2014 | Berger | ................ | B60L 11/1803 307/10.1 |
| 2016/0072423 A1* | 3/2016 | Kanazawa | .............. | H02P 27/06 180/444 |
| 2016/0268951 A1* | 9/2016 | Cho | ...................... | H02M 7/483 |
| 2016/0351488 A1* | 12/2016 | Kamiyama | ........ | H01L 23/49838 |
| 2016/0359372 A1* | 12/2016 | Lee | ........... | H04W 4/80 |
| 2017/0373629 A1* | 12/2017 | Shin | ................ | H02P 21/22 |
| 2018/0054089 A1* | 2/2018 | Lee | ........... | H02J 50/10 |
| 2018/0067148 A1* | 3/2018 | Tsuchida | ................ | G01R 19/18 |
| 2018/0123495 A1* | 5/2018 | Baurle | ................ | H02H 7/1225 |
| 2018/0159442 A1* | 6/2018 | Newton | ............ | H02M 7/53871 |
| 2018/0201302 A1* | 7/2018 | Sonoda | .................. | B62D 5/046 |
| 2018/0277513 A1* | 9/2018 | Macheiner | ........ | H01L 23/49805 |
| 2018/0331647 A1* | 11/2018 | Matsuzaki | ............ | H02M 1/08 |
| 2019/0214928 A1* | 7/2019 | Ghaderi | ................ | H02P 21/22 |
| 2019/0260209 A1* | 8/2019 | Nishikawa | ................ | H02J 7/00 |
| 2019/0319572 A1* | 10/2019 | Okanoue | ......... | H02M 7/53875 |
| 2020/0067435 A1* | 2/2020 | Nishimiya | ................ | H02P 6/12 |

FOREIGN PATENT DOCUMENTS

JP  2016-197985 A  11/2016
WO  WO 2012/073582 A1  6/2012

OTHER PUBLICATIONS

English translation of the International Preliminary Report on Patentability dated Aug. 6, 2020 in PCT/JP2018/002473 filed Jan. 26, 2018, 5 pages.

* cited by examiner

ELECTRONIC MODULE

TECHNICAL FIELD

The present invention relates to electronic modules.

BACKGROUND ART

Conventionally known semiconductor devices include an electronic module configured to convert DC power inputted from a DC power supply to AC power and output the AC power.

The electronic module is used, for example, to convert a DC voltage to a three-phase AC voltage for driving a three-phase motor (for example, see JP 2016-197985 A and JP 2015-020368 A).

In such a conventional electronic module, a shunt resistor is provided to each phase, and a layout including power supply terminals, high-side switches, low-side switches, shunt resistors, and ground terminals is divided into respective phases, each of which has a different current path for a motor current (induced current).

In other words, in the electronic module, the length of the current path for the motor current flowing through the power supply terminal, the high-side switch, the low-side switch, the shunt resistor, and the ground terminal differs in each phase.

The differences in the length of the current path for the motor current may cause differences in value of the motor current in the respective phases.

Furthermore, since the shunt resistor and a signal terminal for detecting a value of the shunt resistor is away from each other (since the shunt resistor is disposed to be close to a power supply wiring line), the inductance of a path for the detected signals is great, and the influence of switching noise on the detected signals is also great.

Since the influence of the switching noise on the detected signals is great in the conventional electronic module, a problem of degradation in accuracy of motor current detection by means of the shunt resistor arises.

DISCLOSURE OF THE INVENTION

Problem to be Solved by the Invention

Under the circumstance, an object of the present invention is to provide an electronic module capable of improving the accuracy of motor current detection by means of a shunt resistor.

Solution to Problem

An electronic module according to an embodiment in an aspect of the present invention is an electronic module configured to convert a direct current to a three-phase alternating current, and supply the three-phase alternating current to a three-phase motor to drive the three-phase motor, the electronic module including:
 a substrate;
 a plurality of signal terminals arranged along a first side of the substrate;
 a power supply terminal, first to third motor terminals connected to coils of the three-phase motor, and a ground terminal, arranged along a second side that is opposite to the first side of the substrate;
 a power supply wiring line disposed on the substrate along the first side, the power supply wiring line being connected to the power supply terminal;
 a first ground wiring line disposed on the substrate along the second side;
 a second ground wiring line disposed the substrate between a fourth side that intersects the first side and the second side of the substrate and the first ground wiring line, the second ground wiring line being connected to the ground terminal;
 first to third half bridges each including a high-side switch and a low-side switch connected in series between the power supply wiring line and the ground wiring line, connection points between the high-side switches and the low-side switches being connected to the first to third motor terminals, and connected in parallel with one another; and
 a shunt resistor having one end that is connected to one end of the first ground wiring line, and another end that is connected to another end of the second ground wiring line,
 wherein the signal terminals include:
 a first current detection terminal disposed to be close to the shunt resistor and electrically connected to the one end of the shunt resistor; and
 a second current detection terminal disposed to be close to the shunt resistor and electrically connected to the other end of the shunt resistor, and
 wherein the shunt resistor is disposed to be close to the first side of the substrate along which the signal terminals are arranged.

The electronic module further includes:
 a first current detection wiring line disposed on the substrate to be close to the first current detection terminal, the first current detection wiring line having one end that is connected to the first current detection terminal and another end that is connected to the one end of the shunt resistor; and
 a second current detection wiring line disposed on the substrate to be close to the second current detection terminal, the second current detection wiring line having one end that is connected to the second current detection terminal and another end that is connected to the other end of the shunt resistor.

In the electronic module,
 the power supply wiring line includes:
 a first portion disposed on a top surface of the substrate and extending along the first side of the substrate; and
 a second portion extending along a third side that intersects the first side and the second side and is opposite to the fourth side of the substrate, the second portion having one end that is connected to one end of the first portion and another end that is connected to another end of the power supply terminal.

In the electronic module,
 the first half bridge includes:
 a first high-side switch disposed on another end of the first portion, the first high-side switch having one end that is connected to the first portion and another end that is connected to the first motor terminal; and
 a first low-side switch having one end that is connected to the first motor terminal and another end that is connected to the first ground wiring line,
 the third half bridge includes:
 a third high-side switch disposed on the one end of the first portion, the third high-side switch having one end that is connected to the first portion and another end that is connected to the third motor terminal; and a third low-side switch having one end that is connected to the third motor terminal and another end that is connected to the first ground wiring line, and the second half bridge includes:

a second high-side switch disposed on the first portion between the first high-side switch and the third high-side switch, the second high-side switch having one end that is connected to the first portion and another end that is connected to the second motor terminal; and a second low-side switch having one end that is connected to the second motor terminal and another end that is connected to the first ground wiring line.

In the electronic module, the power supply terminal, the first motor terminal, the second motor terminal, the third motor terminal, and the ground terminal are arranged from the third side in this order along the second side of the substrate.

The electronic module further includes:

a first central wiring line disposed on the top surface of the substrate between the first portion of the power supply wiring line and the first ground wiring line, the first central wiring line being close to the first high-side switch and electrically connected to the other end of the first high-side switch and the first motor terminal;

a second central wiring line disposed on the top surface of the substrate between the first portion of the power supply wiring line and the first ground wiring line, the second central wiring line being close to the second high-side switch and electrically connected to the other end of the second high-side switch and the second motor terminal; and a third central wiring line disposed on the top surface of the substrate between the first portion of the power supply wiring line and the first ground wiring line, the third central wiring line being close to the third high-side switch and electrically connected to the other end of the third high-side switch and the third motor terminal.

The electronic module further includes:

a first output wiring line disposed on the top surface of the substrate to be close to the first central wiring line;

a second output wiring line disposed on the top surface of the substrate to be close to the second central wiring line;

a third output wiring line disposed on the top surface of the substrate to be close to the third central wiring line;

a first output switch disposed on the first output wiring line, and having one end that is connected to the first output wiring line and another end that is connected to the first motor terminal;

a second output switch disposed on the second output wiring line, and having one end that is connected to the second output wiring line and another end that is connected to the second motor terminal; and a third output switch disposed on the third output wiring line, and having one end that is connected to the third output wiring line and another end that is connected to the third motor terminal.

In the electronic module, the first motor terminal, the second motor terminal, and the third motor terminal are disposed between the power supply terminal and the ground terminal.

In the electronic module, a first length of a first current path from the power supply terminal to the ground terminal via the first motor terminal, a second length of a second current path from the power supply terminal to the ground terminal via the second motor terminal, and a third length of a third current path from the power supply terminal to the ground terminal via the third motor terminal are set to reduce differences in inductance and impedance.

In the electronic module, the first to third low-side switches and the first to third output switches are arranged in a first direction in which the first side extends.

The electronic module further includes a sealing member configured to seal the power supply wiring line, the first and second ground wiring lines, the first to third half bridges, and the shunt resistor at least on the substrate.

In the electronic module, the signal terminals include a first thermistor terminal and a second thermistor terminal; and the electronic module includes:

a thermistor configured to detect a temperature and disposed to be close to the first side of the substrate between another end of the first portion the power supply wiring line and the first current detection wiring line on the substrate;

a first thermistor wiring line disposed on the substrate to be close to the first thermistor terminal, the first thermistor having one end that is connected to the first thermistor terminal and another end that is connected to one end of the thermistor; and a second thermistor wiring line disposed on the substrate to be close to the second thermistor terminal, the second thermistor wiring line having one end that is connected to the second thermistor terminal and another end that is connected to another end of the thermistor.

In the electronic module, the thermistor, the first and second thermistor wiring lines, and a part of the one end of the first ground wiring line of the ground wiring line are arranged between the shunt resistor and the power supply wiring line to separate the shunt resistor away from the power supply wiring line.

The electronic module further includes a first capacitor disposed on the substrate between the second central wiring line and the third central wiring line, the first capacitor having one end that is connected to the first portion of the power supply wiring line, and another end that is connected to the first ground wiring line.

The electronic module further includes a second capacitor disposed on the substrate between the first central wiring line and the second central wiring line, the second capacitor having one end that is connected to the first portion of the power supply wiring line;

a connection wiring line disposed on the top surface of the substrate between the first output wiring line and the first central wiring line, the connection wiring line connected to another end of the second capacitor; and a resistor having one end th at is connected to the connection wiring line and another end that is connected to the first ground wiring line.

Effects of the Invention

An electronic module in an aspect of the present invention is an electronic module configured to convert a direct current to a three-phase alternating current, and supply the three-phase alternating current to a three-phase motor to drive the three-phase motor, the electronic module including:

a substrate;

a plurality of signal terminals arranged along a first side of the substrate;

a power supply terminal, first to third motor terminals connected to coils of the three-phase motor, and a ground terminal, arranged along a second side that is opposite to the first side of the substrate;

a power supply wiring line disposed on the substrate along the first side, the power supply wiring line being connected to the power supply terminal;

a first ground wiring line disposed on the substrate along the second side;

a second ground wiring line disposed the substrate between a fourth side that intersects the first side and the second side of the substrate and the first ground wiring line, the second ground wiring line being connected to the ground terminal;

first to third half bridges each including a high-side switch and a low-side switch connected in series between the power supply wiring line and the ground wiring line, connection points between the high-side switches and the low-side switches being connected to the first to third motor terminals, and connected in parallel with one another; and a shunt resistor having one end that is connected to one end of the first ground wiring line, and another end that is connected to another end of the second ground wiring line.

The signal terminals include: a first current detection terminal disposed to be close to the shunt resistor and electrically connected to the one end of the shunt resistor; and a second current detection terminal disposed to be close to the shunt resistor and electrically connected to the other end of the shunt resistor.

The shunt resistor is disposed to be close to the first side of the substrate along which the signal terminals are arranged.

Thus, in the electronic module in an aspect of the present invention, the signal terminals are disposed along the first side of the substrate, the power supply terminal, the ground terminal, and output terminals of the motor are disposed along the second side of the substrate, the half bridges are disposed between the power supply wiring line and the first ground wiring line, and the shunt resistor shared by the half bridges of the respective phases is connected to the first and second ground wiring lines and disposed to be close to the first side of the substrate X, along which the first and second current detection terminals are arranged (so as to dispose the shunt resistor to be away from the power supply wiring line).

This reduces the impedance of the path of the signal detected by the shunt resistor Shunt and decreases the influence of switching noise caused on the detected signal by the half bridges.

Thus, the electronic module according to the present invention may improve the accuracy of the detection of a motor current by means of a shunt resistor.

EMBODIMENTS FOR CARRYING OUT THE INVENTION

Embodiments of the present invention will now be described with reference to the accompanying drawings.

First Embodiment

Figure 1:
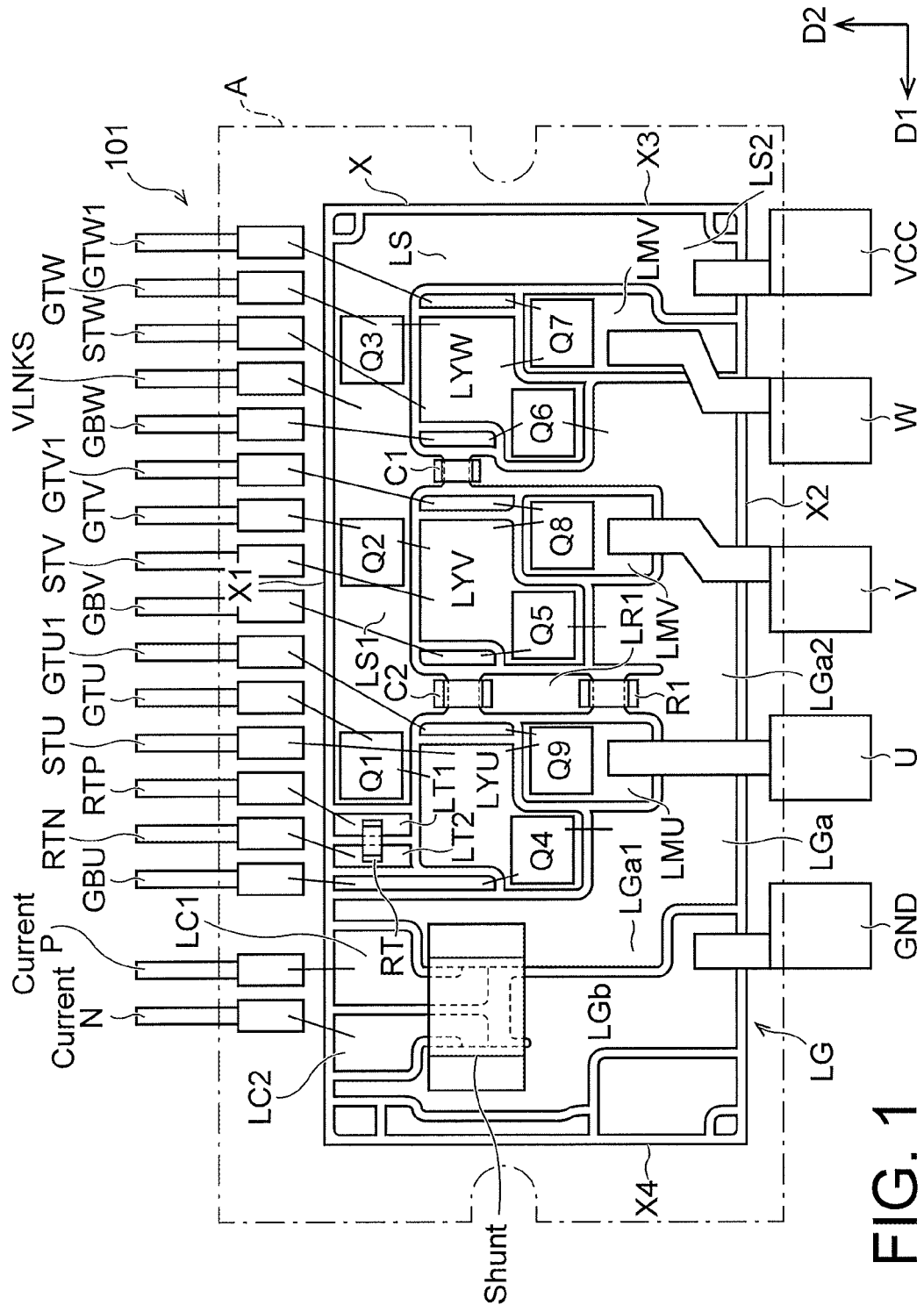
FIG. 1 is a top view of an example of a configuration of an electronic module 100 according to a first embodiment.
Figure 2:
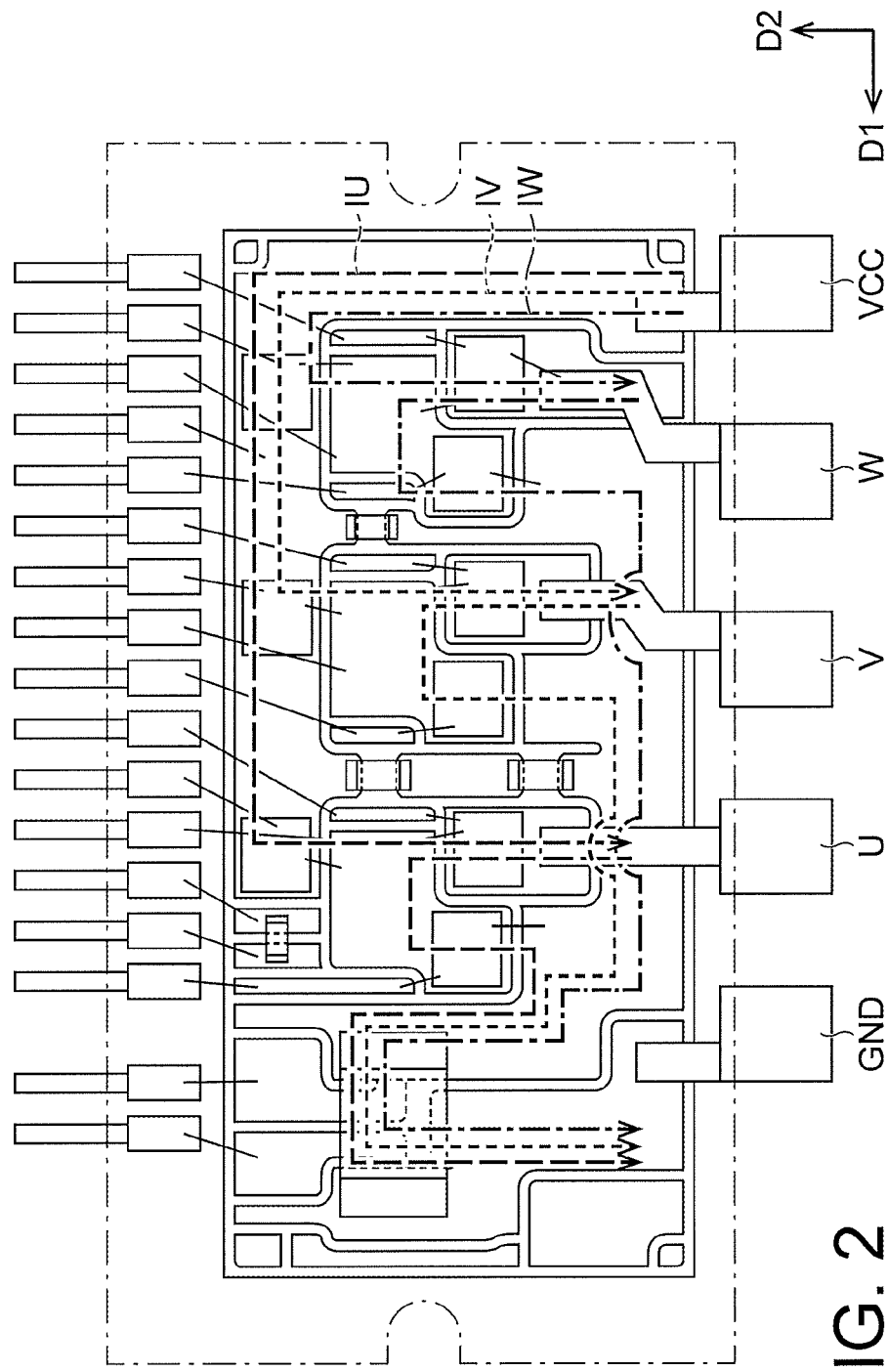
FIG. 2 is a diagram illustrating an example of current paths of the electronic module 100 shown in FIG. 1.
Figure 3:
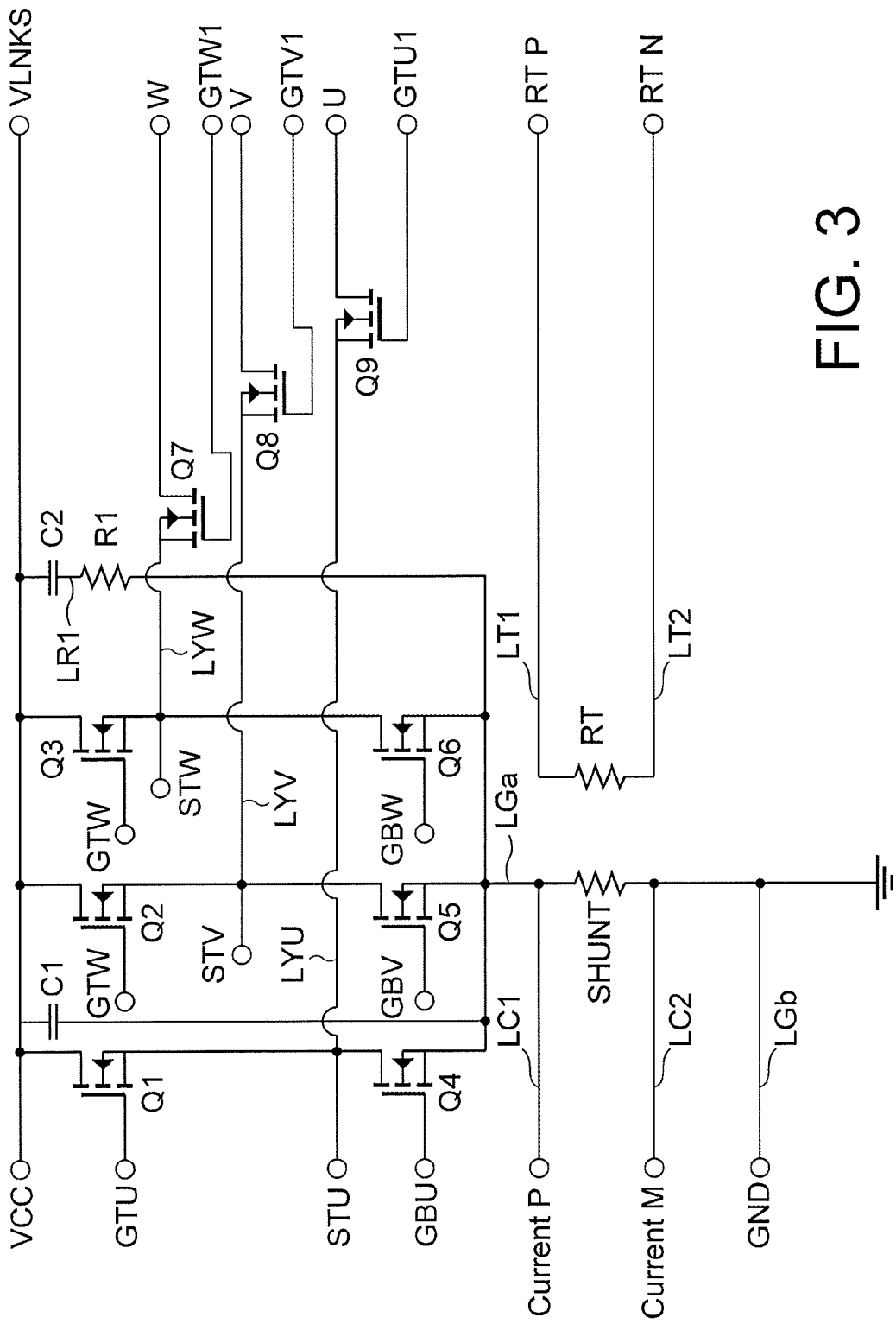
FIG. 3 is a circuit diagram of the example of the circuit configuration of the electronic module 100 shown in FIG. 1.

FIG. 1 is a top view of an example of a configuration of an electronic module 100 according to a first embodiment. FIG. 2 is a diagram illustrating an example of current paths of the electronic module 100 shown in FIG. 1. FIG. 3 is a circuit diagram of an example of a circuit configuration of the electronic module 100 shown in FIG. 1. In FIGS. 1 and 2, a sealing member A is illustrated to be transparent. In FIG. 2, some of the reference numerals provided in FIG. 1 are omitted for simplicity.

For example, the electronic module 100 according to the first embodiment is an inverter device configured to convert a direct current to a three-phase alternating current, and supply the three-phase alternating current to a three-phase motor to drive the three-phase motor.

As shown in FIGS. 1 to 3, the electronic module 100 includes a substrate X, a plurality of signal terminals 101, a power supply wiring line LS, a ground wiring line LG, a power supply terminal VCC, first to third motor terminals U, V, and W, a ground terminal GND, a first half bridge (Q1, Q4), a second half bridge (Q2, Q5), a third half bridge (Q3, Q6), a first output switch Q9, a second output switch Q8, a third output switch Q7, a first central wiring line LYU, a second central wiring line LYV, a third central wiring line LYW, a first output wiring line LMU, a second output wiring line LMV, a third output wiring line LMW, a connection wiring line LR1, a shunt resistor Shunt, a first current detection wiring line LC1, a second current detection wiring line LC2, a first capacitor C1, a second capacitor C2, a resistor R1, a thermistor RT, a first thermistor wiring line LT1, a second thermistor wiring line LT2, and a sealing member A.

The substrate X is, for example, an insulating substrate such as a ceramic substrate.

The substrate X has a rectangular shape. The length of a first side X1 of the substrate X and the length of a second side X2 that is opposite to the first side X1 are the same. The length of a third side X3 and the length of the fourth side X4 that is opposite to the third side X3 is the same in the substrate X. The first side X1 is longer than the third side X3 in the substrate X.

The first side X1 of the substrate X extends along a first direction D1, which is perpendicular to a second direction D2 along which the third side X3 of the substrate X extends.

The signal terminals 101 are arranged in the first direction D1, along the first side X1 of the substrate X.

As shown in FIGS. 1 and 3, the signal terminals 101 include signal terminals STU, STV, and STW, signal terminals GTU, GTV, and GTW for controlling first to third high-side switches Q1, Q2, and Q3, signal terminals GBU, GBV, and GBW for controlling first to third low-side switches Q4, Q5, and Q6, signal terminals GTU1, GTV1, and GTW1 for controlling the first to third output switches Q9, Q8, Q7, a signal terminal VLNKS electrically connected to the power supply wiring line LS, a first thermistor terminal RTP, a second thermistor terminal RTN, a first current detection terminal CurrentP, and a second current detection terminal CurrentN.

A DC power supply voltage is applied to the power supply terminal VCC.

The first to third motor terminals (U, V, W) are connected to three coils of the three-phase motor, respectively.

More specifically, the first motor terminal U is connected to a first phase (U phase) coil of the three-phase motor. The second motor terminal V is connected to a second phase (V phase) coil of the three-phase motor. The third motor terminal W is connected to a third phase (W phase) coil of the three-phase motor.

The ground terminal GND is grounded.

The power supply terminal VCC, the first to third motor terminals U, V, and W, and the ground terminal GND are arranged in the first direction D along the second side X2 that is opposite to the first side X1 of the substrate X, as shown in FIG. 1, for example.

The first motor terminal U, the second motor terminal V, and the third motor terminal W are disposed between the power supply terminal VCC and the ground terminal GND, as shown in particular in FIG. 1, for example.

The power supply terminal VCC, the first motor terminal U, the second motor terminal V, the third motor terminal W, and the ground terminal GND are arranged in this order from the third side X3 in the first direction D along the second side X2 of the substrate X.

As shown in FIG. 1, the power supply wiring line LS is arranged along the first side X1 of the substrate X and connected to the power supply terminal VCC.

The power supply wiring line LS has a first portion LS1 and a second portion LS2, as shown in FIG. 1, for example.

The first portion LS1 is disposed on the top surface of the substrate X and extends along the first side X1 of the substrate X.

The second portion LS2 extends along the third side X3 that intersects the first side X1 and the second side X2 of the substrate X. One end of the second portion LS2 is connected to one end of the first portion LS1, and the other end is connected to one end of the power supply terminal VCC.

As shown in FIG. 1, the ground wiring line LG is disposed on the substrate X along the second side X2, and connected to the ground terminal GND.

The ground wiring line LG includes, for example, a first ground wiring line LGa and a second ground wiring line LGb, as shown in FIG. 1.

The first ground wiring line LGa is disposed on the substrate X along the second side X2 in the first direction D1.

The second ground wiring line LGb is disposed on the substrate X so as to intersect the first side X1 and the second side X2 of the substrate X and be located between the fourth side X4 that is opposite to the third side X3 and the first ground wiring line LGa. The second ground wiring line LGb is connected to one end of the ground terminal GND.

As shown in FIG. 1, the first to third half bridges (Q1, Q4), (Q2, Q5), (Q3, Q6) are disposed between the power supply wiring line LS (first portion LS1) and the ground wiring line LG (first ground wiring line LGa) in a manner that the high-side switch Q1 and the low-side switch Q4 are connected in series, the high-side switch Q2 and the low-side switch Q5 are connected in series, and the high-side switch Q3 and the low-side switch Q6 are connected in series.

Furthermore, the first to third half bridges (Q1, Q4), (Q2, Q5), (Q3, Q6) are connected in a manner that the connection point between the high-side switch Q1 and the low-side switch Q4, the connection point between the high-side switch Q2 and the low-side switch Q5, and the connection point between the high-side switch Q3 and the low-side switch Q6 are connected to the first to third motor terminals U, V, and W, respectively, and also connected in parallel to one another.

More specifically, the first half bridge (Q1, Q4) includes the first high-side switch Q1 and the first low-side switch Q4, as shown in, for example, FIGS. 1 and 3.

The first high-side switch Q1 is disposed on the other end of the first portion LS1 of the power supply wiring line LS. One end of the first high-side switch Q1 is connected to the first portion LS1, and the other end is connected to the first motor terminal U.

One end of the first low-side switch Q4 is connected to the first motor terminal U via the first output switch Q9, and the other end is connected to the ground wiring line LG (first ground wiring line LGa).

The third half bridge (Q3, Q6) includes the third high-side switch Q3 and the third low-side switch Q6, as shown in, for example, FIGS. 1 and 3.

The third high-side switch Q3 is disposed on the one end of the first portion LS1 of the power supply wiring line LS. One end of the third high-side switch Q3 is connected to the first portion LS1, and the other end is connected to the third motor terminal W via the third output switch Q7.

One end of the third low-side switch Q6 is connected to the third motor terminal W via the third output switch Q7, and the other end is connected to the ground wiring line LG (first ground wiring line LGa).

The second half bridge includes the second high-side switch Q2 and the second low-side switch Q5, as shown in, for example, FIGS. 1 and 3.

The second high-side switch Q2 is disposed on the first portion LS1 between the first high-side switch Q1 and the third high-side switch Q3. One end of the second high-side switch Q2 is connected to the first portion LS1, and the other end is connected to the second motor terminal V via the second output switch Q8.

One end of the second low-side switch Q5 is connected to the second motor terminal V via the second output switch Q8, and the other end is connected to the first ground wiring line LGa.

The first central wiring line LYU is disposed on the top surface of the substrate X between the first portion LS1 of the power supply wiring line LS and the first ground wiring line LGa, as shown in FIG. 1 for example.

The first central wiring line LYU is disposed to be close to the first high-side switch Q1, and electrically connected to the other end of the first high-side switch Q1 and the first motor terminal U.

The first low-side switch Q4 is disposed on the first central wiring line LYU. The one end of the first low-side switch Q4 is connected to the first central wiring line LYU.

The second central wiring line LYV is disposed on the top surface of the substrate X between the first portion LS1 of the power supply wiring line LS and the first ground wiring line LGa, as shown in FIG. 1 for example.

The second central wiring line LYV is disposed to be close to the second high-side switch Q2, and electrically connected to the other end of the second high-side switch Q2 and the second motor terminal V.

The second low-side switch Q5 is disposed on the second central wiring line LYV. The one end of the second low-side switch Q5 is connected to the second central wiring line LYV.

The third central wiring line LYW is disposed on the top surface of the substrate X between the first portion LS1 of the power supply wiring line LS and the first ground wiring line LGa, as shown in FIG. 1 for example.

The third central wiring line LYW is disposed to be close to the third high-side switch Q3, and electrically connected to the other end of the third high-side switch Q3 and the third motor terminal W.

The third low-side switch Q6 is disposed on the third central wiring line LYW. The one end of the third low-side switch Q6 is connected to the third central wiring line LYW.

The first output wiring line LMU is disposed on the top surface of the substrate X so as to be close to the first central wiring line LYU, as shown in FIG. 1 for example.

The second output wiring line LMV is disposed on the top surface of the substrate X so as to be close to the second central wiring line LYV, as shown in FIG. 1 for example.

The third output wiring line LMW is disposed on the top surface of the substrate X so as to be close to the third central wiring line LMW, as shown in FIG. 1 for example.

The first output switch Q9 is disposed on the first output wiring line LMU, as shown in FIG. 1 for example. One end of the first output switch Q9 is connected to the first output wiring line LMU (signal terminal STU), and the other end is connected to the first motor terminal U, as shown in, for example, FIGS. 1 and 3.

The second output switch Q8 is disposed on the second output wiring line LMV, as shown in FIG. 1 for example. One end of the second output switch Q8 is connected to the second output wiring line LMV (signal terminal STV), and the other end is connected to the second motor terminal V, as shown in, for example, FIGS. 1 and 3.

The third output switch Q7 is disposed on the third output wiring line LMW, as shown in FIG. 1 for example. One end of the third output switch Q7 is connected to the third output wiring line LMW (signal terminal STW), and the other end is connected to the third motor terminal W, as shown in, for example, FIGS. 1 and 3.

The first to third low-side switches Q4, Q5, and Q6, and the first to third output switches Q9, Q8, and Q7 are arranged in the first direction D1 along which the first side X1 extends, as shown in FIG. 1 for example.

As shown in FIG. 3 for example, the first to third high-side switches Q1, Q2, and Q3, the first to third low-side switches Q4, Q5, and Q6, and the first to third output switches Q9, Q8, and Q7 are MOSFETs. One of the signal terminals 101 is connected to a gate terminal of one of these MOSFETs.

Specifically, the gate terminals of the first to third high-side switches Q1, Q2, and Q3, which are control terminals, are connected to the signal terminals GTU, GTV, and GTW, respectively (FIG. 3).

The gate terminals of the first to third low-side switches Q4, Q5, and Q6, which are control terminals, are connected to the signal terminals GBU, GBV, and GBW, respectively (FIG. 3).

The gate terminals of the first to third output switches Q9, Q8, and Q7, which are control terminals, are connected to the signal terminals GTU1, GTV1, and GTW1, respectively (FIG. 3).

The shunt resistor Shunt is disposed to be close to the first side X1 of the substrate X, as shown in FIG. 1 for example. One end of the shunt resistor Shunt is connected to one end LGa1 of the first ground wiring line LGa, and the other end is connected to the other end of the second ground wiring line LGb.

As described above, the signal terminals 101 include the first current detection terminal CurrentP and the second current detection terminal CurrentN.

The first current detection terminal CurrentP is electrically connected to the one end of the shunt resistor Shunt via the first current detection wiring line LC1.

The second current detection terminal CurrentN is electrically connected to the other end of the shunt resistor Shunt via the second current detection wiring line LC2.

The first current detection wiring line LC1 is disposed on the substrate X to be close to the first current detection terminal CurrentP, as shown in FIG. 1 for example. One end of the first current detection wiring line LC1 is connected to the first current detection terminal CurrentP, and the other end is connected to the one end of the shunt resistor Shunt.

The second current detection wiring line LC2 is disposed on the substrate X to be close to the second current detection terminal CurrentN, as shown in FIG. 1 for example. One end of the second current detection wiring line LC2 is connected to the second current detection terminal CurrentN, and the other end is connected to the other end of the shunt resistor Shunt.

The first capacitor C1 is disposed on the substrate X between the second central wiring line LYV and the third central wiring line LYW, as shown in FIG. 1 for example.

One end of the first capacitor C1 is connected to the first portion LS1 of the power supply wiring line LS, and the other end is connected to the ground wiring line LG (first ground wiring line LGa).

The second capacitor C2 is disposed on the substrate X between the first central wiring line LYU and the second central wiring line LYV, as shown in FIG. 1 for example.

One end of the second capacitor C2 is connected to the first portion LS1 of the power supply wiring line LS.

The connection wiring line LR1 is disposed on the top surface of the substrate X between the first output wiring line LMU and the first central wiring line LYV. The one end of the second capacitor C2 is connected to the connection wiring line LR1.

One end of the resistor R1 is connected to the connection wiring line LR1, and the other is connected to the ground wiring line LG (first ground wiring line LGa).

The thermistor RT for detecting the temperature is disposed on the substrate X to be close to the first side X1 of the substrate X between the other end of the first portion LS1 of the power supply wiring line LS and the first current detection wiring line LC1, as shown in FIG. 1 for example.

As described above, the signal terminals 101 include the first thermistor terminal RTP and the second thermistor terminal RTN.

The first thermistor terminal RTP is electrically connected to one end of the thermistor RT via the first thermistor wiring line LT1.

The second thermistor terminal RTN is electrically connected to the other end of the thermistor RT via the second thermistor wiring line LT2.

The first thermistor wiring line LT1 is disposed on the substrate X to be close to the first thermistor terminal RTP, as shown in FIG. 1 for example. One end of the first thermistor wiring line LT1 is connected to the first thermistor terminal RTP, and the other end is connected to the one end of the thermistor RT.

The second thermistor wiring line LT2 is disposed on the substrate X to be close to the second thermistor terminal RTN, as shown in FIG. 1 for example. One end of the second thermistor wiring line LT2 is connected to the second thermistor terminal RTN, and the other end is connected to the other end of the thermistor RT.

The sealing member A is formed of a sealing resin such as an epoxy resin.

The sealing member A seals the power supply wiring line LS, the ground wiring line LG, the first to third output wiring lines LMU, LMV, and LMW, the first to third central wiring lines LYU, LYV, and LYW, the first current detection wiring line LC1, the second current detection wiring line LC2, the connection wiring line LR1, the first thermistor wiring line LT1, the second thermistor wiring line LT2, the first capacitor C1, the second capacitor C2, the resistor R1, the first to third high-side switches Q1, Q2, and Q3, the first to third low-side switches Q4, Q5, and Q6, the first to third output switches Q9, Q8, and Q7, the thermistor RT, and the shunt resistor Shunt at least on the substrate X, as shown in FIG. 1 for example.

The sealing member A also seals one end of each of the signal terminals 101 along the first side X1 of the substrate X.

The sealing member A also seals one end of each of the power supply terminal VCC, the first motor terminal U, the second motor terminal V, the third motor terminal W, and the ground terminal GND along the first side X1 of the substrate X.

As shown in FIG. 2, for example, a first length of a first current path IW from the power supply terminal VCC to the ground terminal GND via the first motor terminal W, a second length of a second current path IV from the power supply terminal VCC to the ground terminal GND via the second motor terminal V, and a third length of a third current path IW from the power supply terminal VCC to the ground terminal GND via the third motor terminal W are set to reduce differences in inductance and impedance among the current paths IU, IV, and IW.

Specifically, the first length of the first current path IW, the second length of the second current path IV, and the third length of the third current path IW are set to approximate to (to be equal to) the same value.

As described above, in the electronic module 100 according to the first embodiment, the signal terminals are disposed along the first side X1 of the substrate X, the power supply terminal, the ground terminal, and the output terminals of the motor are disposed along the second side X2 of the substrate X, the half bridges are disposed between the power supply wiring line LS and the first ground wiring line LGa, and the shunt resistor Shunt that is shared by the half bridges of the respective phases and connected to the first and second ground wiring lines LGa and LGb is disposed to be close to the first side X1 of the substrate X along which the first and second current detection terminals CurrentP and CurrentN are arranged.

The thermistor RT, the first and second thermistor wiring lines, and the ground wiring line LG (a part of the one end LGa1 of the first ground wiring line LGa) are disposed between the shunt resistor Shunt and the power supply wiring line LS so that the shunt resistor Shunt is disposed away from the power supply wiring line LS (FIG. 1).

This reduces the impedance of the path of the signal detected by the shunt resistor Shunt and decreases the influence of switching noise caused on the detected signal by the half bridges in the electronic module 100 according to the first embodiment.

Second Embodiment

In the first embodiment described above, the first to third high-side switches Q1, Q2, and Q3, the first to third low-side switches Q3, Q5, and Q6, and the first to third output switches Q9, Q8, and Q7 are nMOSFET (FIG. 3). However, other types of semiconductor elements may also be used.

Specifically, the first to third high-side switches Q1, Q2, and Q3, the first to third low-side switches Q3, Q5, and Q6, and the first to third output switches Q9, Q8, and Q7 may be pMOSFETs or other semiconductor elements as long as the same function may be performed.

The configuration of the electronic module according to the second embodiment is the same as that of the first embodiment.

As described above, an electronic module according to an aspect of the present invention is an electronic module configured to convert a direct current to a three-phase alternating current, and supply the three-phase alternating current to a three-phase motor to drive the three-phase motor, the electronic module including:

a substrate;

a plurality of signal terminals arranged along a first side of the substrate;

a power supply terminal, first to third motor terminals connected to coils of the three-phase motor, and a ground terminal, arranged along a second side that is opposite to the first side of the substrate;

a power supply wiring line disposed on the substrate along the first side, the power supply wiring line being connected to the power supply terminal;

a first ground wiring line disposed on the substrate along the second side;

a second ground wiring line disposed the substrate between a fourth side that intersects the first side and the second side of the substrate and the first ground wiring line, the second ground wiring line being connected to the ground terminal;

first to third half bridges each including a high-side switch and a low-side switch connected in series between the power supply wiring line and the ground wiring line, connection points between the high-side switches and the low-side switches being connected to the first to third motor terminals, and connected in parallel with one another; and a shunt resistor having one end that is connected to one end of the first ground wiring line, and another end that is connected to another end of the second ground wiring line.

The signal terminals include:

a first current detection terminal disposed to be close to the shunt resistor and electrically connected to the one end of the shunt resistor; and a second current detection terminal disposed to be close to the shunt resistor and electrically connected to the other end of the shunt resistor.

The shunt resistor is disposed to be close to the first side of the substrate along which the signal terminals are arranged.

Thus, in the electronic module in an aspect of the present invention, the signal terminals are disposed along the first side of the substrate, the power supply terminal, the ground terminal, and output terminals of the motor are disposed along the second side of the substrate, the half bridges are disposed between the power supply wiring line and the first ground wiring line, and the shunt resistor shared by the half bridges of the respective phases is connected to the first and second ground wiring lines and disposed to be close to the first side of the substrate X, along which the first and second current detection terminals are arranged (so as to dispose the shunt resistor to be away from the power supply wiring line).

This reduces the impedance of the path of the signal detected by the shunt resistor Shunt and decreases the influence of switching noise caused on the detected signal by the half bridges.

While certain embodiments have been described, these embodiments have been presented by way of example only, and are not intended to limit the scope of the inventions. The embodiments may be embodied in a variety of other forms. Furthermore, various omissions, substitutions and changes in the form of the methods and systems described herein may be made without departing from the spirit of the inventions. The embodiments and their modifications are included in the scope and the subject matter of the invention, and at the same time included in the scope of the claimed inventions and their equivalents.

EXPLANATION OF REFERENCES

100: electronic module
X: substrate
101: signal terminals
LS: power supply wiring line
LG: ground wiring line
VCC: power supply terminal
U, V, W: first to third motor terminals
GND: ground terminal
Q1: first high-side switch
Q4: first low-side switch
Q2: second high-side switch
Q5: second low-side switch
Q3: third high-side switch
Q6: third low-side switch
Q9: first output switch
Q8: second output switch
Q7: third output switch
LYU: first central wiring line
LYV: second central wiring line
LYW: third central wiring line
LMU: first output wiring line
LMV: second output wiring line
LMW: third output wiring line
LR1: connection wiring line
Shunt: shunt resistor
LC1: first current detection wiring line
LC2: second current detection wiring line
C1: first capacitor
C2: second capacitor
R1: resistor
RT: thermistor
LT1: first thermistor wiring line
LT2: second thermistor wiring line
A: sealing member

The invention claimed is:

1. An electronic module configured to convert a direct current to a three-phase alternating current, and supply the three-phase alternating current to a three-phase motor to drive the three-phase motor, the electronic module comprising:
a substrate;
a plurality of signal terminals arranged along a first side of the substrate;
a power supply terminal, first to third motor terminals connected to coils of the three-phase motor, and a ground terminal, arranged along a second side that is opposite to the first side of the substrate;
a power supply wiring line disposed on the substrate along the first side, the power supply wiring line being connected to the power supply terminal;
a first ground wiring line disposed on the substrate along the second side;
a second ground wiring line disposed on the substrate between a fourth side that intersects the first side and the second side of the substrate and the first ground wiring line, the second ground wiring line being connected to the ground terminal;
first to third half bridges each including a high-side switch and a low-side switch connected in series between the power supply wiring line and the ground wiring line, connection points between the high-side switches and the low-side switches being connected to the first to third motor terminals, and connected in parallel with one another; and
a shunt resistor having one end that is connected to one end of the first ground wiring line, and another end that is connected to another end of the second ground wiring line,
wherein the signal terminals include:
a first current detection terminal disposed to be close to the shunt resistor and electrically connected to the one end of the shunt resistor; and
a second current detection terminal disposed to be close to the shunt resistor and electrically connected to the other end of the shunt resistor,
wherein the shunt resistor is disposed to be close to the first side of the substrate along which the signal terminals are arranged, and
wherein a part of the one end of the first ground wiring line of the ground wiring line is arranged between the shunt resistor and the power supply wiring line to separate the shunt resistor away from the power supply wiring line.

2. The electronic module according to claim 1, further comprising:
a first current detection wiring line disposed on the substrate to be close to the first current detection terminal, he first current detection wiring line having one end that is connected to the first current detection terminal and another end that is connected to the one end of the shunt resistor; and
a second current detection wiring line disposed on the substrate to be close to the second current detection terminal, the second current detection wiring line having one end that is connected to the second current detection terminal and another end that is connected to the other end of the shunt resistor.

3. The electronic module according to claim 2, wherein the power supply wiring line includes:
a first portion disposed on a top surface of the substrate and extending along the first side of the substrate; and
a second portion extending along a third side that intersects the first side and the second side and is opposite to the fourth side of the substrate, the second portion having one end that is connected to one end of the first portion and another end that is connected to another end of the power supply terminal.

4. The electronic module according to claim 3, wherein the first half bridge includes:
a first high-side switch disposed on another end of the first portion, the first high-side switch having one end that is connected to the first portion and another end that is connected to the first motor terminal; and
a first low-side switch having one end that is connected to the first motor terminal and another end that is connected to the first ground wiring line,
wherein the third half bridge includes:
a third high-side switch disposed on the one end of the first portion, the third high-side switch having one end that is connected to the first portion and another end that is connected to the third motor terminal; and
a third low-side switch having one end that is connected to the third motor terminal and another end that is connected to the first ground wiring line, and wherein the second half bridge includes:
a second high-side switch disposed on the first portion between the first high-side switch and the third high-side switch, the second high-side switch having one end that is connected to the first portion and another end that is connected to the second motor terminal; and
a second low-side switch having one end that is connected to the second motor terminal and another end that is connected to the first ground wiring line.

5. The electronic module according to claim 3, wherein the power supply terminal, the first motor terminal, the second motor terminal, the third motor terminal, and the ground terminal are arranged from the third side in this order along the second side of the substrate.

6. The electronic module according to claim 4, further comprising:
a first central wiring line disposed on the top surface of the substrate between the first portion of the power supply wiring line and the first ground wiring line, the first central wiring line being close to the first high-side switch and electrically connected to the other end of the first high-side switch and the first motor terminal;
a second central wiring line disposed on the top surface of the substrate between the first portion of the power supply wiring line and the first ground wiring line, the second central wiring line being close to the second high-side switch and electrically connected to the other end of the second high-side switch and the second motor terminal; and
a third central wiring line disposed on the top surface of the substrate between the first portion of the power supply wiring line and the first ground wiring line, the third central wiring line being close to the third high-side switch and electrically connected to the other end of the third high-side switch and the third motor terminal.

7. The electronic module according to claim 6, further comprising:
a first output wiring line disposed on the top surface of the substrate to be close to the first central wiring line;
a second output wiring line disposed on the top surface of the substrate to be close to the second central wiring line;
a third output wiring line disposed on the top surface of the substrate to be close to the third central wiring line;
a first output switch disposed on the first output wiring line, and having one end that is connected to the first output wiring line and another end that is connected to the first motor terminal;
a second output switch disposed on the second output wiring line, and having one end that is connected to the second output wiring line and another end that is connected to the second motor terminal; and
a third output switch disposed on the third output wiring line, and having one end that is connected to the third output wiring line and another end that is connected to the third motor terminal.

8. The electronic module according to claim 1, wherein the first motor terminal, the second motor terminal, and the third motor terminal are disposed between the power supply terminal and the ground terminal.

9. The electronic module according to claim 1, wherein a first length of a first current path from the power supply terminal to the ground terminal via the first motor terminal, a second length of a second current path from the power supply terminal to the ground terminal via the second motor terminal, and a third length of a third current path from the power supply terminal to the ground terminal via the third motor terminal are set to reduce differences in inductance and impedance.

10. The electronic module according to claim 7, wherein the first to third low-side switches and the first to third output switches are arranged in a first direction in which the first side extends.

11. The electronic module according to claim 8, further comprising a sealing member configured to seal the power supply wiring line, the first and second ground wiring lines, the first to third half bridges, and the shunt resistor at least on the substrate.

12. The electronic module according to claim 3,
wherein the signal terminals include a first thermistor terminal and a second thermistor terminal, and
wherein the electronic module includes:
a thermistor configured to detect a temperature and disposed to be close to the first side of the substrate between another end of the first portion the power supply wiring line and the first current detection wiring line on the substrate;
a first thermistor wiring line disposed on the substrate to be close to the first thermistor terminal, the first thermistor having one end that is connected to the first thermistor terminal and another end that is connected to one end of the thermistor; and
a second thermistor wiring line disposed on the substrate to be close to the second thermistor terminal, the second thermistor wiring line having one end that is connected to the second thermistor terminal and another end that is connected to another end of the thermistor.

13. The electronic module according to claim 12, wherein the thermistor, the first and second thermistor wiring lines, and a part of the one end of the first ground wiring line of the ground wiring line are arranged between the shunt resistor and the power supply wiring line to separate the shunt resistor away from the power supply wiring line.

14. The electronic module according to claim 7, further comprising a first capacitor disposed on the substrate between the second central wiring line and the third central wiring line, the first capacitor having one end that is connected to the first portion of the power supply wiring line, and another end that is connected to the first ground wiring line.

15. The electronic module according to claim 14, further comprising:
a second capacitor disposed on the substrate between the first central wiring line and the second central wiring line, the second capacitor having one end that is connected to the first portion of the power supply wiring line;
a connection wiring line disposed on the top surface of the substrate between the first output wiring line and the first central wiring line, the connection wiring line being connected to another end of the second capacitor; and
a resistor having one end that is connected to the connection wiring line and another end that is connected to the first ground wiring line.

* * * * *